US010823973B2

(12) United States Patent
Ma et al.

(10) Patent No.: US 10,823,973 B2
(45) Date of Patent: Nov. 3, 2020

(54) LASER LIGHT PROJECTION MODULE HAVING TRANSPARENT CONDUCTIVE FILM WITH INSULATING COLLOID IN CONNECTING JUNCTION

(71) Applicant: TRIPLE WIN TECHNOLOGY (SHENZHEN) CO. LTD., Shenzhen (CN)

(72) Inventors: Xiao-Mei Ma, Guangdong (CN); Shin-Wen Chen, New Taipei (TW); Long-Fei Zhang, Guangdong (CN); Kun Li, Guangdong (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/435,994

(22) Filed: Jun. 10, 2019

(65) Prior Publication Data
US 2020/0285139 A1 Sep. 10, 2020

(30) Foreign Application Priority Data

Mar. 8, 2019 (CN) .......................... 2019 1 0177236

(51) Int. Cl.
*G03B 21/20* (2006.01)
*G02B 27/09* (2006.01)
*H05K 1/02* (2006.01)
(52) U.S. Cl.
CPC ....... *G02B 27/0944* (2013.01); *H05K 1/0296* (2013.01)

(58) Field of Classification Search
CPC ............ G03B 21/2086; G03B 21/2053; G03B 21/2033; G03B 21/20; F21V 23/0457; F21V 23/007; F21V 23/003–005; F21K 9/65; F21Y 2115/30
See application file for complete search history.

(56) References Cited

U.S. PATENT DOCUMENTS

| 4,916,579 | A  | * | 4/1990  | Simms ................... G03B 15/03 362/18 |
| 6,953,251 | B2 | * | 10/2005 | Seki ....................... G03B 21/26 353/85 |
| 7,213,929 | B2 | * | 5/2007  | Imade .................... G02B 26/02 348/801 |
| 7,658,500 | B2 | * | 2/2010  | Jin ........................ G03B 21/145 353/119 |
| 8,278,841 | B2 | * | 10/2012 | Brukilacchio ............ F21K 9/00 315/152 |

(Continued)

*Primary Examiner* — Ismael Negron
(74) *Attorney, Agent, or Firm* — ScienBiziP, P.C.

(57) ABSTRACT

A light projecting module for use in electronic devices, the light projecting module including a circuit board having a laser light source, a seat mounted on the circuit board, a transparent conductive film mounted on a surface of the seat away the circuit board, at least one conductive layer formed on the seat and having first and second end portions, at least one conductive ball electrically connecting the first end portion to the transparent conductive film, and at least one insulating colloid formed at a junction of the transparent conductive film, the first end portion, and the conductive ball. The second end portion of the at least one conductive layer is electrically connected to the circuit board.

20 Claims, 5 Drawing Sheets

(56) References Cited

U.S. PATENT DOCUMENTS

| | | | |
|---|---|---|---|
| 8,985,784 B2* | 3/2015 | Lin | F21V 14/02 |
| | | | 353/87 |
| 2005/0030493 A1* | 2/2005 | Wu | H04N 9/3141 |
| | | | 353/119 |
| 2006/0092383 A1* | 5/2006 | Vinson | G03B 21/142 |
| | | | 353/69 |
| 2006/0227817 A1* | 10/2006 | Chang | G01C 15/004 |
| | | | 372/9 |
| 2012/0162616 A1* | 6/2012 | Lee | G03B 21/2033 |
| | | | 353/97 |
| 2016/0091777 A1* | 3/2016 | Kuan | G03B 15/03 |
| | | | 362/16 |
| 2019/0331988 A1* | 10/2019 | Chen | G02B 27/425 |

* cited by examiner

LASER LIGHT PROJECTION MODULE HAVING TRANSPARENT CONDUCTIVE FILM WITH INSULATING COLLOID IN CONNECTING JUNCTION

FIELD

The subject matter herein generally relates to light projecting devices and user safety.

BACKGROUND

The core component in a depth camera is a light projecting module. The light projecting module generally includes a diffractive assembly, a seat, a collimating lens, a laser light source, and a circuit board. To prevent the laser light emitted by the laser light source from harming humans in the picture, a transparent conductive film is used to cover the surface of the diffractive assembly. The transparent conductive film detects an amount of energy emitted by the laser light source. When the energy detected exceeds a preset safety standard, the circuit board turns off the laser light source, thereby avoiding eye injury.

Currently, the electrical connection between the transparent conductive film and the circuit board is established by solder or conductive adhesive. However, in a high-temperature and/or high-humidity environment, the electrical resistance of the conductive adhesive becomes high and the conductivity of the solder may become unstable. Lowered electrical conductivity of the conductive adhesive can decrease the accuracy of detecting a safety standard being exceeded.

Therefore, there is room for improvement.

BRIEF DESCRIPTION OF THE DRAWINGS

Implementations of the present technology will now be described, by way of embodiments, with reference to the attached figures.

DETAILED DESCRIPTION

Figure 1:
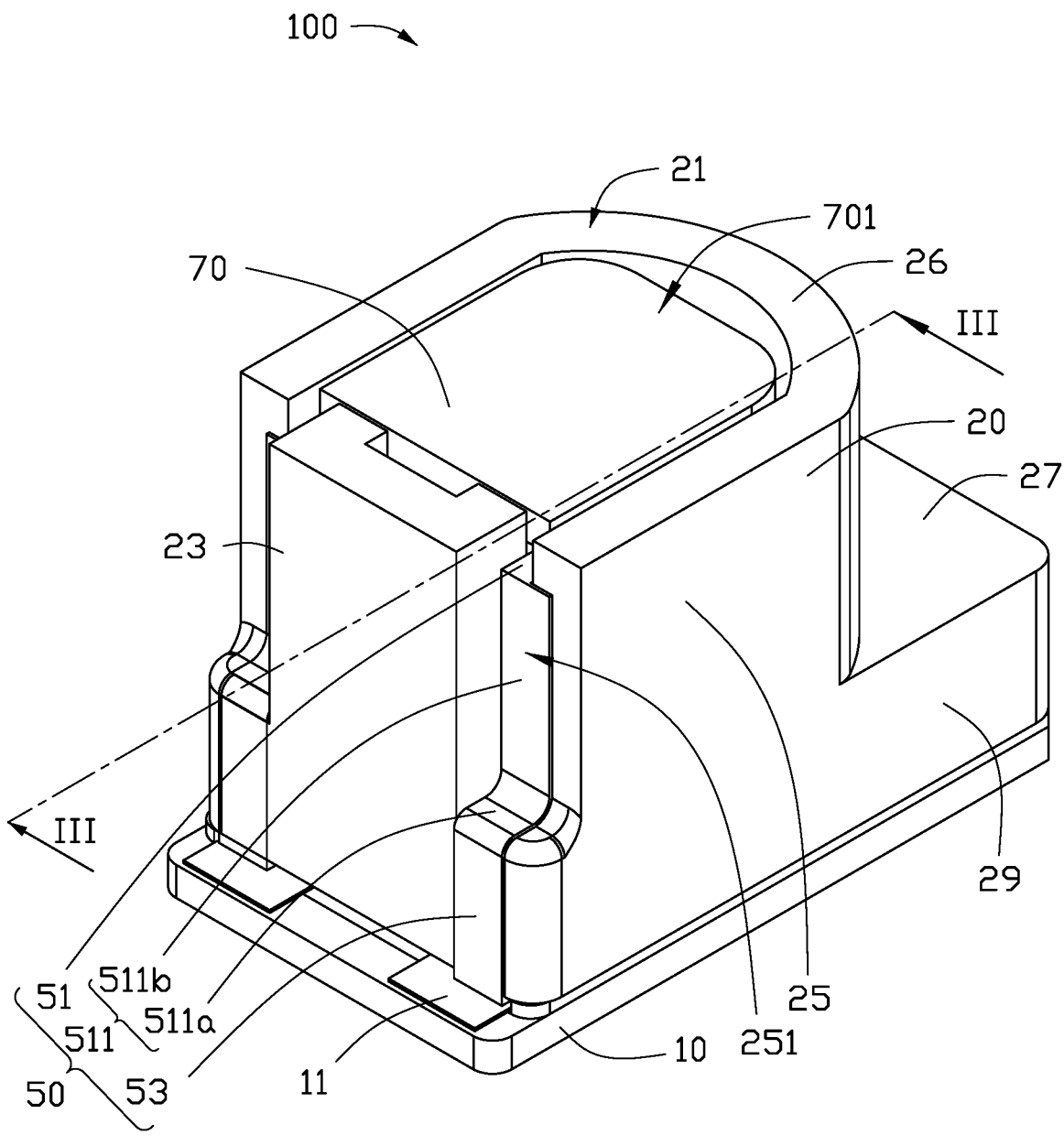
FIG. 1 is an isometric view of a light projection module structured for safety according to an embodiment of the present disclosure.

The present disclosure is made in conjunction with the accompanying drawings. Specific embodiments of the present disclosure are described.

In the following description, when an element is described as being "fixed to" another element, the element can be fixed to another element with or without intermediate elements. When an element is described as "connecting" another element, the element can be connected to the other element with or without intermediate elements. Without a given definition otherwise, all terms used have the same meaning as commonly understood by those skilled in the art.

Referring to FIG. 1 to FIG. 4, a light projection module 100 structured for safety is provided to emit a specific pattern of light. The light projection module 100 includes a circuit board 10, a seat 20, and a transparent conductive film 30 (see FIGS. 3 and 4), at least one conductive ball 40 (see FIGS. 2, 4), at least one conductive layer 50, and at least one insulating colloid 60.

The seat 20 is mounted on the circuit board 10. The seat 20 includes a first surface 21 away from the circuit board 10. The transparent conductive film 30 is mounted on the first surface 21 of the seat 20. The conductive layer 50 is formed on the seat 20, and includes a first end portion 51 and a second end portion 53 opposite to each other. The first end portion 51 is electrically connected to the transparent conductive film 30 via the conductive ball 40. The second end portion 53 is electrically connected to the circuit board 10. The insulating colloid 60 is formed at the point where the transparent conductive film 30, the first end portion 51, and the conductive ball 40 are connected together (i.e., a junction of the transparent conductive film 30, the first end portion 51, and the conductive ball 40). The insulating colloid 60 wraps the junction to ensure a stable electrical connection between the transparent conductive film 30 and the first end portion 51 under high temperature and high humidity conditions.

The insulating colloid 60 is made of an insulating resin, to enable use in high temperature and/or high humidity environments. The conductive ball 40 is isolated from components other than the first end portion 51 and the transparent conductive film 30. Thereby, the first end portion 51, the conductive balls 40, and the transparent conductive film 30 have stable electrical connections in all conditions. In the embodiment, the insulating resin is selected from one or more dielectric materials such as an epoxy resin, a phenol resin, a polyimide, and a polyethylene terephthalate.

Figure 4:
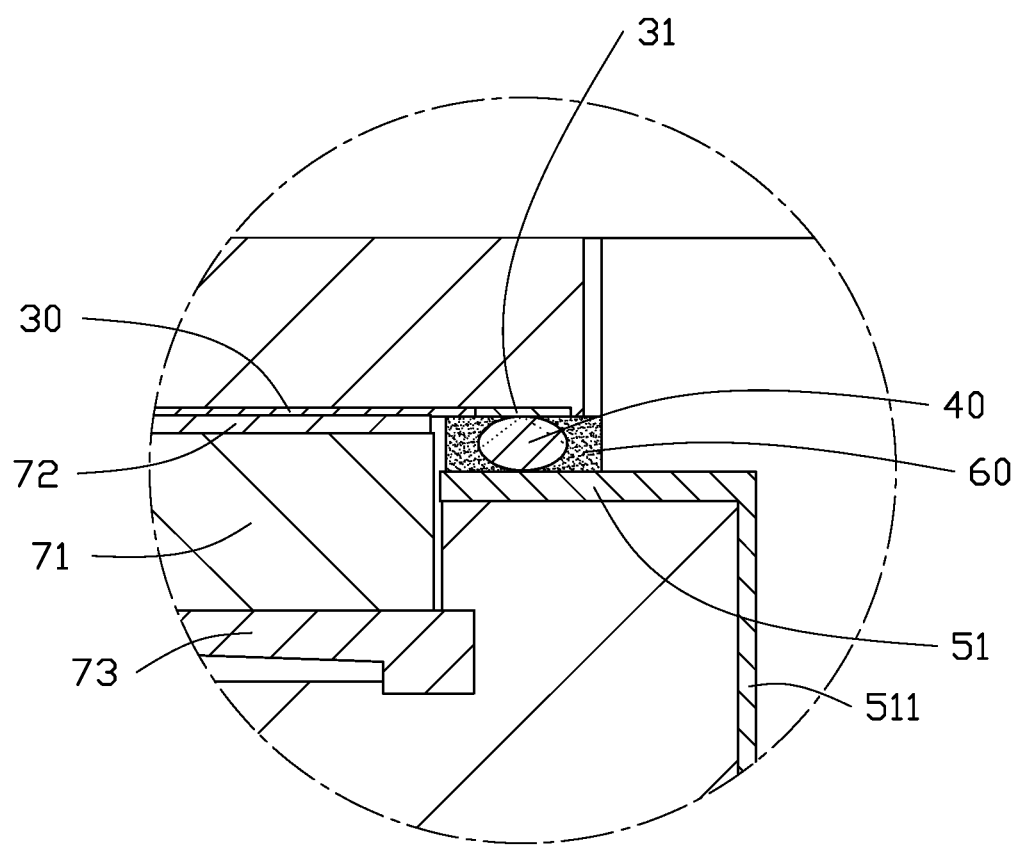
FIG. 4 is an enlarged view of a circular area IV of FIG. 3.

Referring to FIG. 4, the transparent conductive film 30 is provided with at least one pad 31 near the first end portion 51. The conductive ball 40 is connected between the first end portion 51 and the pad 31.

The transparent conductive film 30 has a variable resistance. The resistance of the transparent conductive film 30 varies according to an intensity of laser light transmitted through the transparent conductive film 30. The transparent conductive film 30 produces electrical signals according to the intensity of the laser light passing through the transparent conductive film 30, so that the intensity of the emitted laser light can be monitored. In the embodiment, a material of the transparent conductive film 30 can be an indium tin oxide, an indium zinc oxide, a cadmium stannate, a cadmium metaborate, or a combination of one or more of the indium tin oxide, the indium zinc oxide, the cadmium stannate, and the cadmium metaborates.

Referring to FIG. 4, electrically connecting the transparent conductive film 30 to the conductive layer 50 includes the steps of (step S1), forming or disposing the conductive ball 40 on the surface of the first end portion 51 close to the pad 31, so that the conductive ball 40 is electrically connected to the first end portion 51. In step S2, laying the transparent conductive film 30 over the conductive ball 40 and making contact between the pad 31 and the conductive ball 40. In step S3, applying ultrasonic waves to or heating the first end portion 51 and the pad 31, so that eutectic reaction occurs and cocrystals are formed at where the conductive ball 40 is in contact with the first end portion 51 and the pad 31, In step S4, injecting insulating glue to surround the conductive ball 40 to form the insulating colloid 60, the insulating colloid 60 wrapping the conductive ball 40 and covering the pad 31 and the first end portion 51, to ensure stability of the electrical connections therebetween.

In the embodiment, the conductive ball 40 is a conductive gold ball. The insulating colloid 60 is an insulating resin selected from one or more of dielectric materials including an epoxy resin, a phenolic resin, a polyimide, and a polyethylene terephthalate.

Figure 2:
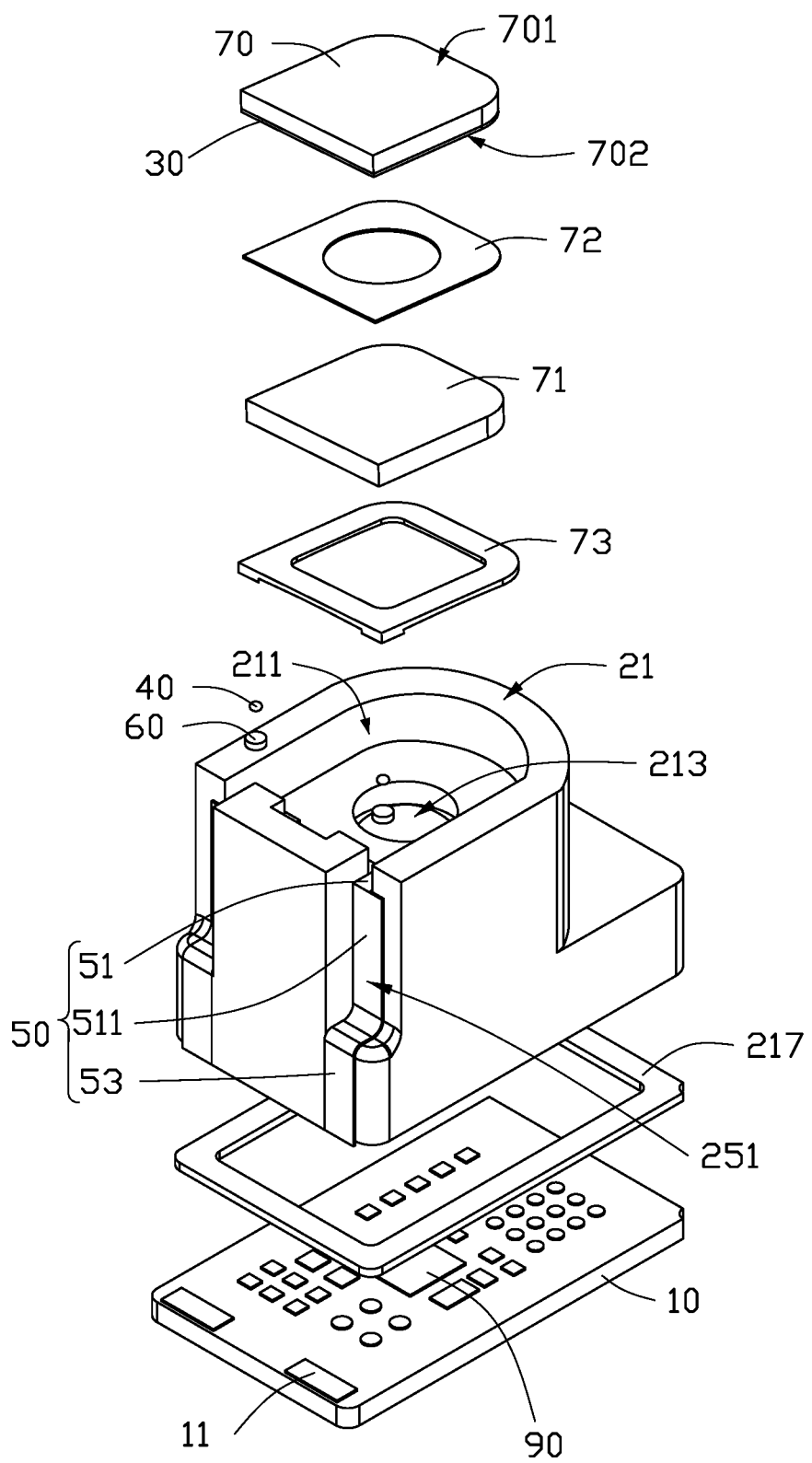
FIG. 2 is an exploded view of the light projection module of FIG. 1.

Referring to FIG. 2, the first surface 21 of the seat 20 is recessed inwardly to form a first receiving cavity 211. A bottom of the first receiving cavity 211 defines a hole through which light can pass (light-passing hole 213). The transparent conductive film 30 is received in the first receiving cavity 211 and covers the light passing hole 213.

In the embodiment, the light projection module 100 further includes a diffraction element 70 and a glass piece 71. The diffraction element 70 and the glass piece 71 are both received in the first receiving cavity 211.

The diffraction element 70 includes a second surface 701 toward the object side which the laser light points and a third surface 702 opposite to the second surface 701. The transparent conductive film 30 is evaporated by vapor deposition process or attached on the second surface 701 or the third surface 702 of the diffraction element 70. In the embodiment, the transparent conductive film 30 is disposed on the third surface 702 (see FIGS. 3 and 4). In another embodiment, the transparent conductive film 30 is disposed on the second surface 701.

The glass piece 71 is fixed between the transparent conductive film 30 and the bottom of the first receiving cavity 211 and covers the light-passing hole 213. In the embodiment, the glass piece 71 is fixed to the transparent conductive film 30 by a first adhesive layer 72, and fixed to the first receiving cavity 211 by a second adhesive layer 73.

Figure 3:
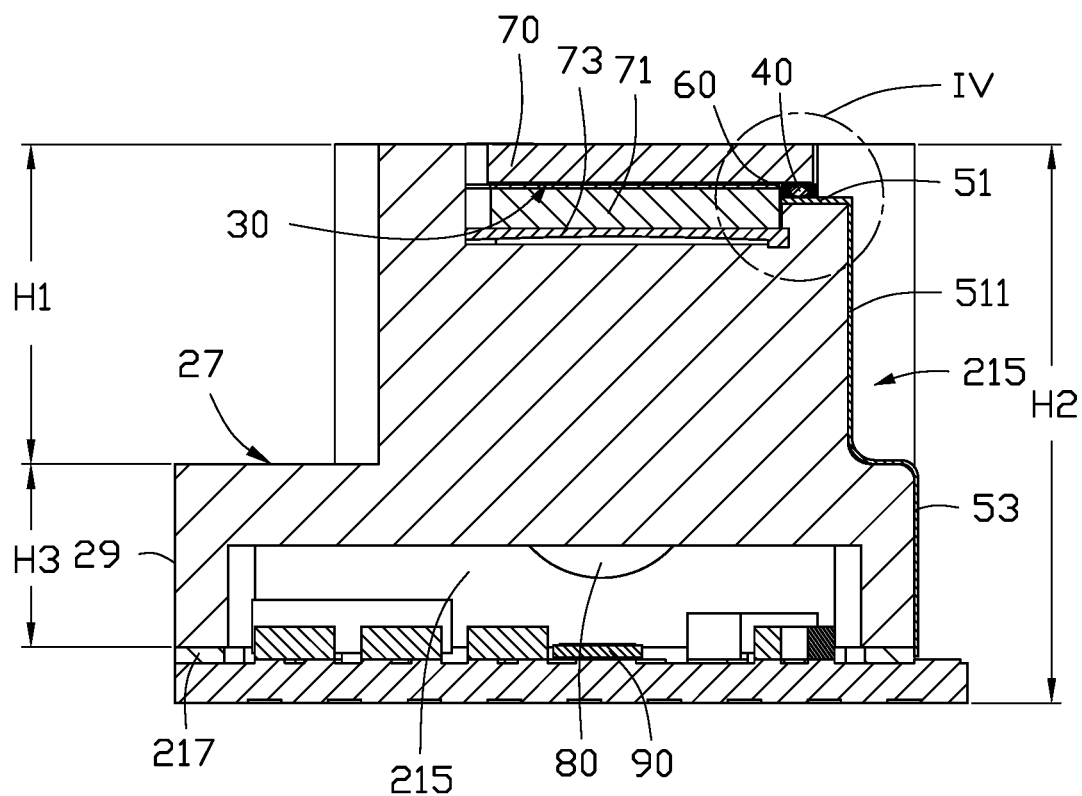
FIG. 3 is a cross-sectional view along line of FIG. 1.

Referring to FIG. 2 and FIG. 3, the seat 20 further includes a first sidewall 23, two second sidewalls 25, and a third side wall 26 extending from the first surface 21 toward the circuit board 10. The third sidewall 26 is opposite to the first sidewall 23. The second sidewalls 25 connects the third sidewall 26 with the first sidewall 23. A height of the third sidewall 26 from the first surface 21 is shorter than heights of the first side wall 23 and the second sidewalls 25 from the first surface 21. The seat 20 further includes a fourth surface 27. The fourth surface 27 is connected to an end of the third sidewall 26 away from the first surface 21 and is parallel to the first surface 21. The seat 20 further includes three fourth sidewalls 29 extending from the fourth surface 27 toward the circuit board 10. The fourth sidewalls 29, the first sidewall 23 and the second sidewalls 25 cooperatively form a second receiving cavity 215. The light-passing hole 213 joins the first receiving cavity 211 and the second receiving cavity 215.

The light projection module 100 further includes a collimating lens 80 and a laser light source 90. The collimating lens 80 is received in the light-passing hole 213, and the laser light source 90 is received in the second receiving cavity 215 and aligned with the collimating lens 80.

In the embodiment, the collimating lens 80 is integrally formed in the light passing hole 213, and the laser light source 90 is a vertical cavity surface emitting laser (VCSEL).

The laser light source 90 is fixed on the circuit board 10 and faces the seat 20. The seat 20 is fixed on the circuit board 10 by a third adhesive layer 217. The circuit board 10 can be a ceramic circuit board.

Referring to FIG. 3, a junction of the first sidewall 23 and the second sidewall 25 is recessed in the form of at least one slot 251. The slot 251 extends from the first surface 21 toward the circuit board 10. An extended length of the slot 251 is smaller than the height of the first side wall 23 from the first surface 21.

The conductive layer 50 further includes a connecting portion 511 formed between the first end portion 51 and the second end portion 53. The connecting portion 511 is substantially L-shaped and is received in the slot 251. The connecting portion 511 includes a first portion 511a substantially parallel to the first surface 211 and a second portion 511b substantially perpendicular to the first portion. The first portion 511a is connected to the second end portion 53 and the second portion 511b is connected to the first end portion 51.

An end of the connecting portion 511 close to the transparent conductive film 30 extends perpendicularly toward the transparent conductive film 30 to form the first end portion 51. An opposite end of the connecting portion 511 extends toward the circuit board 10 to form the second end portion 53. The second end portion 53 is formed on the first sidewall 23. The material of the conductive layer 50 is selected from conductive metals such as copper, aluminum, silver, gold, etc. The conductive layer 50 is formed by laser forming technology (LDS) or injection molding technology.

At least one contact leg 11 is formed on the circuit board 10 and electrically connected with the second end portion 53. In the embodiment, the second end portion 53 and the contact leg 11 are electrically connected by solder or by conductive glue.

Figure 5:
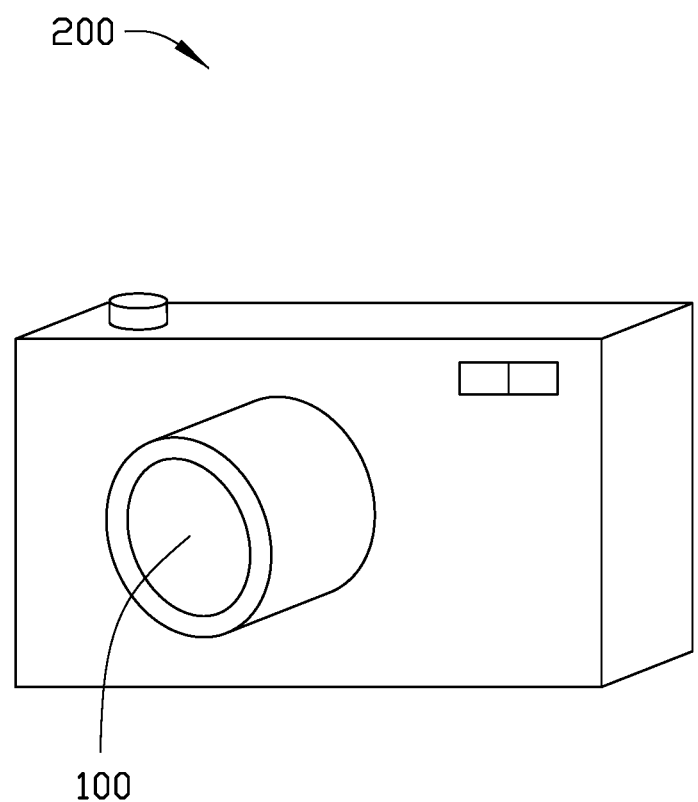
FIG. 5 is an isometric view of an electronic device utilizing the light projection module of FIG. 1 according to an embodiment of the present disclosure.

Referring to FIG. 5, an electronic device 200 including the light projection module 100 is shown. The electronic device 200 can be a depth camera, a smart phone, a smart bracelet, a smart watch, a tablet, smart glasses, a smart helmet, or a somatosensory game device.

The light projection module provided by the present disclosure utilizes the conductive ball to connect the transparent conductive film and the conductive layer, and utilizes the insulating colloid to wrap the junction, thereby increasing the stability of electrical connection and user safety when using the light projection module.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims.

What is claimed is:

1. A light projection module comprising a circuit board, a seat, a transparent conductive film, at least one conductive ball, at least one conductive layer, and at least one insulating colloid; wherein the seat is mounted on the circuit board and comprises a first surface away from the circuit board, the transparent conductive film is mounted on the first surface, the conductive layer is formed on the seat, the conductive layer comprises a first end portion and a second end portion, the first end portion is electrically connected to the transparent conductive film by the conductive ball, and the second end portion is electrically connected to the circuit board, the insulating colloid is formed at a junction of the transparent conductive film, the first end portion, and the conductive ball.

2. The light projection module as claimed in claim 1, wherein at least one contact leg is formed on the circuit board electrically connected with the second end portion.

3. The light projection module as claimed in claim 1, wherein the transparent conductive film is provided with at least one pad, the conductive ball is connected between the first end portion and the pad.

4. The light projection module as claimed in claim 3, wherein a material of the transparent conductive film is one or more of an indium tin oxide, an indium zinc oxide, a cadmium stannate, and a cadmium metasilicate.

5. The light projection module as claimed in claim 3, wherein the conductive ball is a conductive gold ball, the insulating colloid is made of an insulating resin selected from one or more dielectric materials comprising an epoxy resin, a phenolic resin, a polyimide, and a polyethylene terephthalate.

6. The light projection module as claimed in claim 3, wherein the first surface of the seat is recessed inwardly to form a first receiving cavity, the first receiving cavity has a bottom defining a light-passing hole, the transparent conductive film is received in the first receiving cavity and covers the light-passing hole.

7. The light projection module as claimed in claim 6, wherein the light projection module further comprises a diffraction element and a glass piece, the diffraction element and the glass piece are received in the first receiving cavity, the transparent conductive film is evaporated or attached on the diffraction element, the glass piece is fixed between the transparent conductive film and the bottom of the first receiving cavity.

8. The light projection module as claimed in claim 7, wherein the seat further comprises a first sidewall, two second sidewalls, and a third sidewall extending from the first surface toward the circuit board; the third side wall is opposite to the first side wall and the second sidewalls connects the third sidewall and the first sidewall, a height of the third side wall from the first surface is smaller than heights of the first side wall and the second sidewalls from the first surface; the seat further comprises a fourth surface connected to an end of the third sidewall away from the first surface and parallel to the first surface, the seat further comprises three fourth sidewalls extending from the fourth surface toward the circuit board, the fourth sidewalls, the first sidewall and the second sidewalls cooperatively form a second receiving cavity, the light-passing hole joins the first receiving cavity and the second receiving cavity.

9. The light projection module as claimed in claim 8, wherein the light projection module further comprises a collimating lens and a laser light source, the collimating lens is received in the light-passing hole, and the laser light source is received in the second receiving cavity and aligned with the collimating lens, the laser light source is fixed on the circuit board and faces the seat.

10. The light projection module as claimed in claim 9, wherein a junction of the first sidewall and the second sidewall is recessed in a form of at least one slot, the slot extends from the first surface toward the circuit board; the conductive layer further comprises a connecting portion connected between the first end portion and the second end portion, the connecting portion is L-shaped and received in the slot.

11. An electronic device comprising a light projection module, wherein the light projection module comprises a circuit board, a seat, a transparent conductive film, at least one conductive ball, at least one conductive layer, and at least one insulating colloid; the seat is mounted on the circuit board and comprises a first surface away from the circuit board, the transparent conductive film is mounted on the first surface, the conductive layer is formed on the seat, the conductive layer comprises a first end portion and a second end portion, the first end portion is electrically connected to the transparent conductive film by the conductive ball, and the second end portion is electrically connected to the circuit board, the insulating colloid is formed at a junction of the transparent conductive film, the first end portion, and the conductive ball.

12. The electronic device as claimed in claim 11, wherein at least one contact leg is formed on the circuit board electrically connected with the second end portion.

13. The electronic device as claimed in claim 11, wherein the transparent conductive film is provided with at least one pad, the conductive ball is connected between the first end portion and the pad.

14. The electronic device as claimed in claim 13, wherein a material of the transparent conductive film is one or more of an indium tin oxide, an indium zinc oxide, a cadmium stannate, and a cadmium metasilicate.

15. The electronic device as claimed in claim 13, wherein the conductive ball is a conductive gold ball, the insulating colloid is made of an insulating resin selected from one or more dielectric materials comprising an epoxy resin, a phenolic resin, a polyimide, and a polyethylene terephthalate.

16. The electronic device as claimed in claim 13, wherein the first surface of the seat is recessed inwardly to form a first receiving cavity, the first receiving cavity has a bottom defining a light-passing hole, the transparent conductive film is received in the first receiving cavity and covers the light-passing hole.

17. The electronic device as claimed in claim 16, wherein the light projection module further comprises a diffraction element and a glass piece, the diffraction element and the glass piece are received in the first receiving cavity, the transparent conductive film is evaporated or attached on the diffraction element, the glass piece is fixed between the transparent conductive film and the bottom of the first receiving cavity.

18. The electronic device as claimed in claim 17, wherein the seat further comprises a first sidewall, two second sidewalls and a third sidewall extending from the first surface toward the circuit board; the third side wall is opposite to the first side wall and the second sidewalls connects the third sidewall and the first sidewall, a height of the third side wall from the first surface is smaller than heights of the first side wall and the second sidewalls from the first surface; the seat further comprises a fourth surface connected to an end of the third sidewall away from the first surface and parallel to the first surface, the seat further comprises three fourth sidewalls extending from the fourth surface toward the circuit board, the fourth sidewalls, the first sidewall and the second sidewalls cooperatively form a second receiving cavity, the light-passing hole joins the first receiving cavity and the second receiving cavity.

19. The electronic device as claimed in claim 18, wherein the light projection module further comprises a collimating lens and a laser light source, the collimating lens is received in the light-passing hole, and the laser light source is received in the second receiving cavity and aligned with the collimating lens, the laser light source is fixed on the circuit board and faces the seat.

20. The electronic device as claimed in claim 19, wherein a junction of the first sidewall and the second sidewall is recessed in a form at least one slot, the slot extends from the first surface toward the circuit board; the conductive layer further comprises a connecting portion connected between the first end portion and the second end portion, the connecting portion is L-shaped and received in the slot.

* * * * *